US006975113B1

(12) United States Patent
Gurr

(10) Patent No.: US 6,975,113 B1
(45) Date of Patent: Dec. 13, 2005

(54) METHOD AND SYSTEM FOR MOVING TABLE MRI WITH PARTIAL FOURIER IMAGING

(75) Inventor: David H. Gurr, Milwaukee, WI (US)

(73) Assignee: General Electric Company, Milwaukee, WI (US)

( * ) Notice: Subject to any disclaimer, the term of this patent is extended or adjusted under 35 U.S.C. 154(b) by 130 days.

(21) Appl. No.: 10/707,170

(22) Filed: Nov. 25, 2003

(51) Int. Cl.$^7$ ................................................ G01V 3/00
(52) U.S. Cl. ...................................... 324/309; 324/307
(58) Field of Search ............................... 324/309, 307, 324/306, 312, 314, 300; 600/412

(56) References Cited

U.S. PATENT DOCUMENTS

| | | | |
|---|---|---|---|
| 4,591,789 A | | 5/1986 | Glover et al. |
| 5,928,148 A | | 7/1999 | Wang et al. |
| 6,067,465 A | * | 5/2000 | Foo et al. ................... 600/410 |
| 6,163,152 A | | 12/2000 | Bernstein et al. |
| 6,166,545 A | * | 12/2000 | Polzin et al. ............... 324/309 |
| 6,242,916 B1 | | 6/2001 | King |
| 6,393,313 B1 | | 5/2002 | Foo |
| 6,560,353 B1 | * | 5/2003 | Haacke et al. ............. 382/128 |
| 6,707,300 B2 | * | 3/2004 | Polzin et al. ............... 324/309 |
| 6,784,664 B2 | * | 8/2004 | Liang et al. ............... 324/309 |
| 2002/0140423 A1 | | 10/2002 | Brittain |
| 2002/0143247 A1 | | 10/2002 | Brittain et al. |
| 2003/0011369 A1 | | 1/2003 | Brittain et al. |

FOREIGN PATENT DOCUMENTS

| | | |
|---|---|---|
| JP | 06304153 | 11/1994 |
| JP | 06311977 | 11/1994 |
| JP | 08173398 | 7/1996 |

OTHER PUBLICATIONS

McGibney, G. et al., "Quantitative Evaluaton of Several Partial Fourier Reconstruction Algorithms Used in MRI", Magnetic Resonance in Medicine, 1993, vol. 30, pp. 51-59.
Barkhausen, J. et al., "Whole-Body MR Imaging in 30 Seconds with Real-Time True FISP and a Continuously Rolling Table Platform: Feasibility Study", Radiology, 2001, vol. 220, pp. 252-256.
Fain, S. et al., "Floating Table 3D Isotropic Projection Imaging (FLIPR): Feasibility of a New Method for Temporally Resolved Imaging with Extended Superior/Inferior Coverage", XIII International Workshop on MRA, 2001, p. 17.
Liang, Z. et al., "Principles of Magnetic Resonance Imaging: A Signal Processing Approach", 2000, pp. 322-300, IEEE Press.
Dietrich, O. et al., "Extending the coverage of true volume scans by continuous movement of the subject", Proc. Intl. Soc. Mag. Reson. Med, 1999, p. 1653.
Cuppen, J. et al., "Reducing MR Imaging Time By One-Sided Reconstruction", Magnetic Resonance Imaging, 1987, vol. 5, No. 6, pp. 526-527.

(Continued)

Primary Examiner—Louis Arana
(74) Attorney, Agent, or Firm—Ziolkowski Patent Solutions Group, SC; Michael A. Della Penna; Carl B. Horton

(57) ABSTRACT

A method for moving table MR imaging with partial Fourier imaging is disclosed. MR data is acquired from a subject to partially fill k-space. The partially filled k-space is then reconstructed to form an image space having a first resolution. The image space is then transformed back into k-space followed by additional processing of the transformed k-space into an image space having a second resolution. A system to implement such a method is also disclosed.

25 Claims, 2 Drawing Sheets

OTHER PUBLICATIONS

Johnson, K. et al., "Total-Body MR Imaging in as Little as 18 Seconds", Radiology, 1997, vol. 202, pp. 262-267.

Brittain, J. et al., "Incremental Table Motion for Increased Volume Coverage", Proc. Intl. Soc. Mag. Reson. Med, 2000, p. 1726.

Haacke, E. et al., "A Fast, Iterative, Partial-Fourier Technique Cabable of Local Phase Recovery", Journal of Magnetic Resonance, 1991, vol. 92, No. 1, pp126-145.

Zhu, Y. et al., "FUSION for Incremental Field-of-View Imaging", Proc. Intl. Soc. Mag. Reson. Med, 2001, p. 9.

Noll, D. et al., "Homodyne Detection in Magnetic Resonance Imaging", IEEE Transactions on Medical Imaging, 1991, vol. 10, pp. 154-163.

Kruger, D. et al., "Continuously moving table data acquisition method for long FOV contrast-enhanced MRA and whole-body MRI", Magn Reson Med, Feb. 2002, vol. 47, No. 2, pp. 224-231.

* cited by examiner

METHOD AND SYSTEM FOR MOVING TABLE MRI WITH PARTIAL FOURIER IMAGING

BACKGROUND OF INVENTION

The present invention relates generally to magnetic resonance (MR) imaging and, more particularly, to a method and system for acquiring MR data from a patient being translated through an imaging volume with partial Fourier imaging.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

A number of imaging techniques have been developed to expedite MR data acquisition and image reconstruction so as to reduce scan time. It is generally well known that accelerating the data acquisition and image reconstruction processes improves image quality through fewer patient motion induced artifacts, improves patient throughput, and improves patient comfort. Two exemplary imaging techniques that have been particularly complementary in the reduction of scan time are partial Fourier Imaging and moving table MR imaging. Partial Fourier imaging typically may be segmented into two different types: (1) partial in the frequency encode direction or (2) partial in the phase encode direction.

For instance, in conventional stationary or non-moving table partial Fourier imaging, with partial acquisition in the frequency encode or readout direction (partial echo) or partial acquisition in the phase encode direction (partial or fractional NEX), only a portion of the k-space is filled with acquired data. With partial echo and partial NEX, the conjugate symmetry of acquired k-space is used to fill the non-acquired portion of k-space. In either case, since less than all the k-space is being filled with actual acquired data, time necessary to fill k-space is dramatically less than would otherwise be required. Further, since less data is acquired to fill k-space, a partial Fourier acquisition has fewer data acquisition intervals (TR) or, alternately, shorter TRs.

Moving table MR imaging is another technique that reduces scan time through the acquisition of MR data from the patient as the patient is translated through the bore of the MR magnet. Moving table MR imaging has been found to greatly reduce overall scan time since multiple slabs may be imaged in a single translation of the patient through the magnet bore. Further, since the patient is being translated through the imaging volume rather than repositioning of a slab to cover various patient cross-sections, slab boundary artifacts are reduced.

Known moving table MR imaging techniques are predicated upon the full data acquisition of k-space. In this regard, moving table MR imaging advantageously supports the acquisition of full k-space data with a reduction in scan time. However, notwithstanding this reduction, additional time is required to acquire a full k-space dataset. In contrast to partial Fourier imaging, conventional moving table imaging requires the acquisition of a full k-space to provide a diagnostically valuable image which negatively affects patient throughput, patient comfort, and patient-induced motion artifacts.

It would therefore be desirable to have a system and method of moving table MR imaging using partial Fourier imaging techniques to further reduce scan time yet provide a clinically and diagnostically probative image.

BRIEF DESCRIPTION OF INVENTION

The present invention provides a system and method of moving table MR data acquisition with partial Fourier imaging that overcomes the aforementioned drawbacks. An MR imaging technique and system to implement such a technique is disclosed for execution of partial Fourier transformation of MR data acquired from a subject being translated through an imaging volume. The MR imaging technique is applicable with both continuous and stepwise (incremental) translation of the subject. Moreover, the present invention is applicable for non-moving table applications where it is desirable to take advantage of Hermitian symmetry later in the reconstruction process. Other applications include MR angiography.

Therefore, in accordance with one aspect of the present invention, a method of MR imaging includes the step of acquiring k-space data for less than all of k-space from a subject as well as the step of reconstructing the k-space data into image data having a first resolution. The method further includes the step of transforming the image data into k-space data as well as the step of processing the transformed k-space data into image data having a second resolution, the second resolution being different from the first resolution.

In accordance with another aspect of the invention, an MRI apparatus includes an MRI system having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MRI apparatus also includes a computer programmed to execute an image generation technique that utilizes Hermitian symmetry and reconstruction of an image from MR data after the MR data has been corrected for non-uniformity.

In accordance with another aspect of the invention, the invention is embodied in a computer program stored on a computer readable storage medium and having instructions which, when executed by a computer, cause the computer to transform a first image space dataset to a k-space dataset. The computer is then caused to partial Fourier reconstruct the k-space dataset into a second image space dataset and generate an image from the second image space dataset.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention.

In the drawings.

DETAILED DESCRIPTION

A system is shown to implement a partial Fourier reconstruction of MR data acquired from a subject translated through an imaging volume during data acquisition and read-out in the direction of table motion. The present invention is equivalently applicable with continuous and stepwise (incremental) translation of the subject during data acquisition. A number of moving table protocols has been developed in which the present invention may be applicable. Three such protocols are disclosed in commonly assigned U.S. Ser. Nos. 09/681,420, 09/682,699, and 10/235,454, each of which is incorporated herein by reference. Further, the present invention may be applicable for non-moving table or non-patient translation applications where it is desired to reduce data acquisition times through utilization of Hermitian conjugate symmetry after the acquired MR data has been corrected for geometric distortions and the like.

Figure 1:
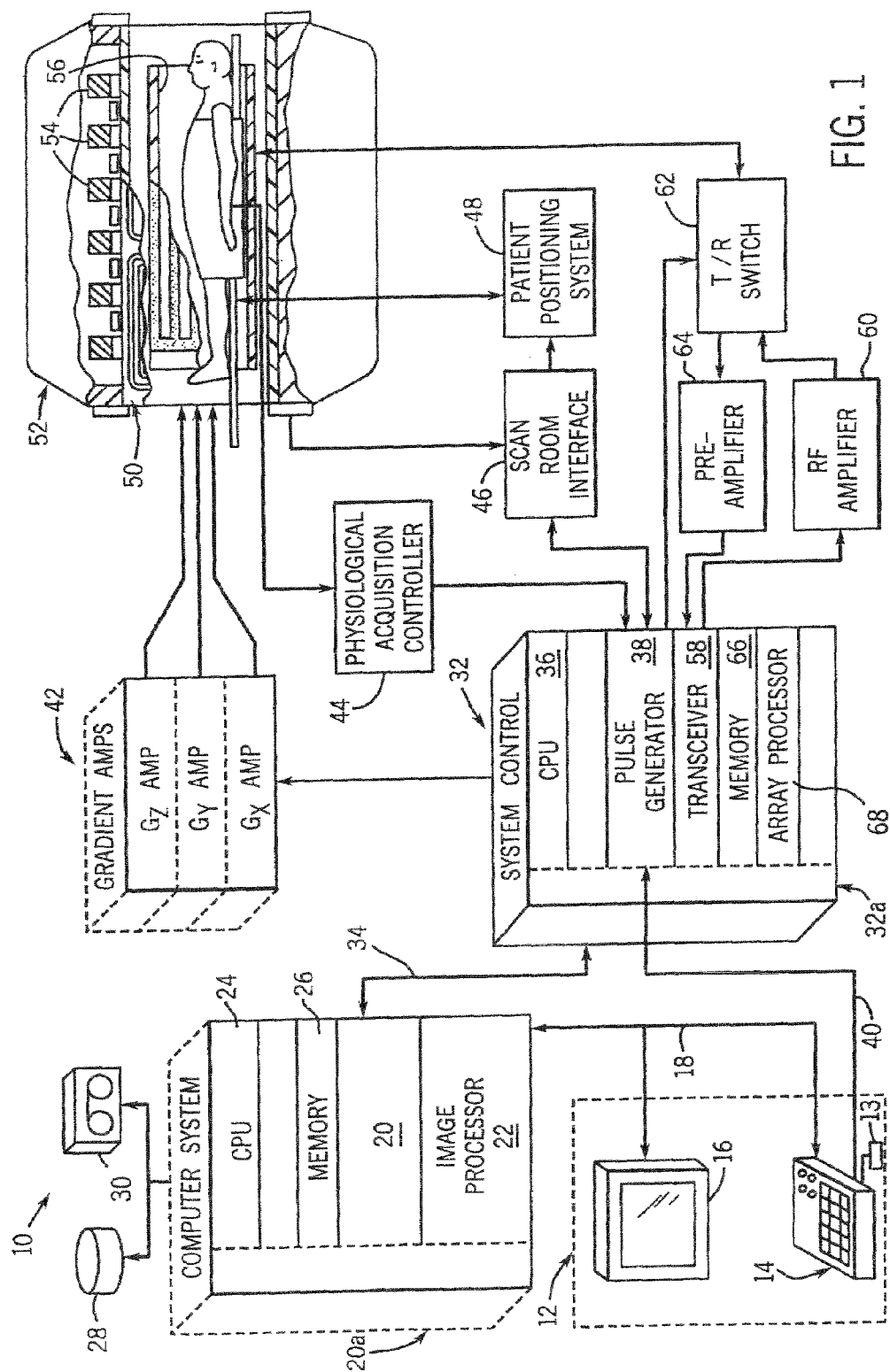
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan. In addition, the patient positioning system 48 may control patient position such that the patient is continuously or incrementally translated during data acquisition.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention includes a method and system suitable for use with the above-referenced MRI system, or any similar or equivalent system for obtaining MR images.

Figure 2:
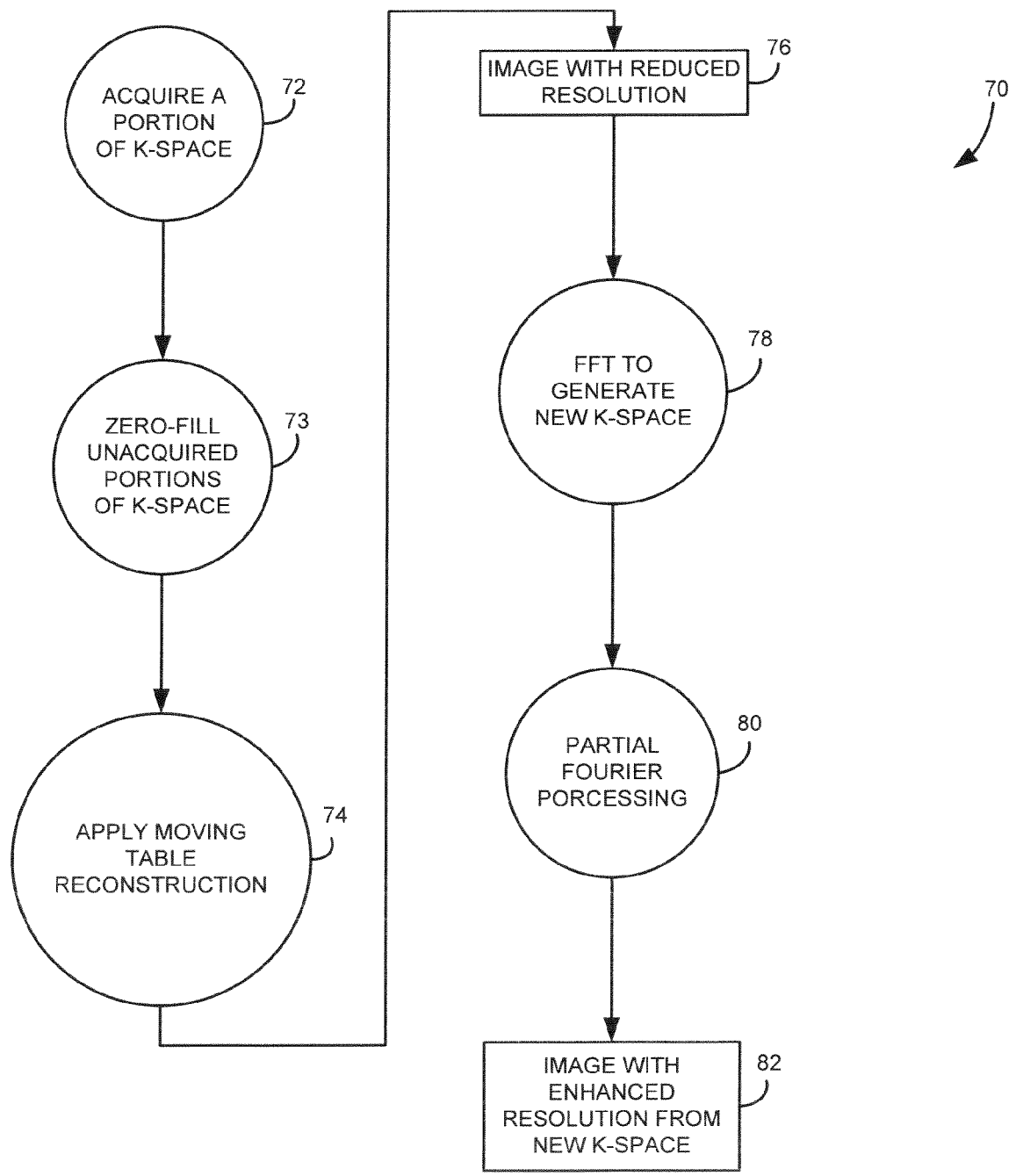
FIG. 2 is a flow chart setting forth the steps of a technique for partial Fourier imaging with moving table MR data acquisition.

Referring now to FIG. 2, the steps of a partial Fourier imaging technique applicable with moving table MR imaging are set forth. Moving table MR imaging includes continuous and incremental repositioning of the subject or imaging volume. The imaging technique will be described as a method to be carried out by an MR system such as that described with respect to FIG. 1. One skilled in the art will readily appreciate that the imaging technique may take the form of executable acts or commands to be carried out by a computer or other processing device.

The imaging technique 70 begins at step 72 with the acquisition of MR data that partially fills k-space. In a partial echo example, a "partial" echo is sampled and data from the partial echo is used to partially fill k-space. That is, less than all or a portion of k-space is acquired. One skilled in the art will readily appreciate that partiality may be carried out in the phase encode direction or the readout direction. That is, the present invention is applicable to any moving table MR imaging protocol wherein less than all of k-space is acquired. In most partial Fourier imaging techniques, roughly half of k-space is acquired. In a moving table application, the MR data is acquired from a subject while the subject is translated either continuously or incrementally through an imaging volume. Accordingly, once the data for less than all of k-space is acquired at 72, the unacquired portions of k-space are replaced with zeroes or "zero-filled" at 73. One skilled in the art will readily appreciate that the k-space may also be "zero-padded" so that the k-space has a desired dimension.

In conventional stationary partial MR imaging, partial Fourier reconstruction is typically carried out following acquisition of k-space. Partial Fourier data acquisition usually uses Hermitian conjugate symmetry to replace missing k-space data. Since Hermitian conjugate symmetry is only effective if the image is real, phase error correction must also be carried out. Phase errors may result from magnetic field inhomogeneity, gradient eddy currents, delays in the gradient amplifiers and receiver electronics, and spatial variation of surface coil receive fields. To carry out a Hermitian conjugate symmetry replacement, these phase errors must first be corrected. Homodyne processing is an example on one reconstruction technique that is typically implemented for phase correction. However, one skilled in the art will readily appreciate that numerous other techniques may be used for phase correction.

Homodyne processing uses a pair of filters for Hermitian conjugate symmetry as well as phase error correction. As is well-known, a homodyne high pass filter doubles the amplitude of the k-space data which is conjugate to the missing k-space data. After a Fourier reconstruction, the imaginary part of the image is discarded to complete the replacement step. That is, the phase correction is carried out by a low pass filter that creates an image from a small portion of k-space data acquired symmetrically around the center of k-space. The phase of this image is then subtracted from the phase of the homodyne high pass filtered image prior to discarding the imaginary part of the image.

In contrast to stationary table MR imaging, moving table MR data acquisition introduces additional phase errors in the k-space data. As such, it is not practical to apply homodyne processing or other similar partial Fourier imaging processes to correct these moving table phase errors. Specifically, as described below, geometric distortions are present in k-space acquired during translation of the subject or imaging volume. As such, moving table reconstruction processes are carried out to correct for these moving table induced phase errors.

With the present invention zero-filling or zero-padding takes place following the partial acquisition of k-space to improve resolution of a final reconstructed image. A moving table reconstruction is then applied at step 74 to correct the acquired data for geometric distortions, table position, and the like. Moving table reconstruction is an effective means of restoring symmetry to k-space that also maintains any zero-filling or zero-padding of the k-space. "GradWarp" correction is one example of moving table reconstruction that may be carried out. GradWarp is a trademark of General Electric Company, Waukesha, Wis.

"GradWarp" is a reconstruction process used to correct geometric distortions in the acquired MR data. Specifically, "GradWarp", which is described in detail in commonly assigned U.S. Pat. No. 4,591,789, issued May 27, 1986 to Glover et al. and is applied as described in commonly assigned U.S. Pat. No. 5,642,047, issued Jun. 24, 1997 to Bernstein, both of which are incorporated herein by reference, is a procedure whereby gradient non-uniformity is corrected. When gradients of a magnetic field vary, i.e. non-uniform, the resulting images may be distorted, or warped. This problem is typically accentuated with increasing distance from the isocenter of the magnet. The resulting images, however, may be corrected using GradWarp or similar correction technique.

"GradWarp" illustrates only one moving table reconstruction technique that may be executed at step 74. For example, the data acquired at the different table positions is preferably sorted and aligned to match anatomic z locations. Alternately, moving table reconstruction may be carried out with exact sized Fourier transforms such that the Fourier reconstruction dimensionally matches that of the partially filled k-space. One skilled in the art will readily appreciate that other reconstruction processes and techniques besides those specifically enumerated and discussed are contemplated and considered within the scope of the invention.

Following correction and other reconstruction processes at 74, a transformed k-space dataset or image space dataset from the partially filled or zero-padded k-space is generated at step 76. One skilled in the art will appreciate that the term "image space" refers to the transformed k-space from which a diagnostic image is reconstructed. Since the image space is generated from less than a full k-space of data, the resolution of an image based on the image space dataset will be less than optimal. Depending on the partiality of the k-space filled at 72 and the reconstruction protocol used, an image derived from the image space generated at 76 may be too blurry to be diagnostically or clinically valuable. As such, in a preferred embodiment, an image is not reconstructed from the transformed k-space or image space generated at step 76. Alternately, it is contemplated that a diagnostic image could be reconstructed from the "partial" image space, but such an image would have less resolution than may be possible, as is described hereafter.

Rather than generate an image from the partial image space, a Fourier transform, preferably a Fast Fourier Transform (FFT), is applied to the partial image space to generate a corrected but partial "new" k-space at 78. One skilled in the art will readily appreciate that other reconstruction processes, such as a Radon transformation, may be carried in place of a FFT. Like the k-space filled at step 72, the k-space generated at step 78 is likewise partially filled with acquired MR data. However, unlike the k-space at step 72, the k-space at step 78 has been corrected for geometric distortions, anatomically aligned, and the like pursuant to the moving table reconstruction processes executed at 74.

Following generation of a "new" or corrected partial k-space 78, a partial Fourier reconstruction is applied to the corrected k-space data at 80 to generate a transformed image space. One or more of a number of partial Fourier reconstruction techniques may be executed and considered applicable with the present invention. For example, "homodyne processing" is a partial Fourier reconstruction technique that may be executed. Another technique that may be carried out is commonly referred to as Projection Onto Convex Sets (POCS). One skilled in the art will readily appreciate that other partial Fourier reconstruction processes, techniques, and/or algorithms may be executed and are considered within the scope of the present invention. As previously described, the partial Fourier reconstruction, such as homodyne processing, operates to replace non-acquired portions of k-space with MR data. The MR data used to fill the unacquired portions of k-space is obtained from the previously acquired MR data. Specifically, Hermitian conjugate symmetry principles are used to fill the unacquired portions of k-space. As noted above taking advantage of Hermitian conjugate symmetry at step 80 is possible as the moving table reconstruction processes executed at step 74 condition the k-space to be receptive to partial Fourier processing.

Once the appropriate partial Fourier reconstruction is carried out at step 80, an image with enhanced resolution is generated at step 82. This enhancement in resolution is a result of the homodyne processing (or other partial Fourier reconstruction) executed at step 80 to take advantage of Hermitian conjugate symmetry to "fill" k-space with non-zero data. In this regard, Hermitian conjugate symmetry is utilized after all the MR data has been collected and corrected. Further, since the MR data acquired at step 72 partially fills k-space, shorter TRs or fewer TRs may be used during the data acquisition process which reduces overall scan time, improves patient throughput, and improves patient comfort that helps reduce the likelihood of patient motion-induced artifacts. Further, for moving table applications, the shorter acquisition times enables faster table velocities and shorter breath-hold times for data acquisition. For example, reducing the number of phase encodes with a partial NEX acquisition allows for an increase in table velocity thereby decreasing scan time. Moreover, the increase in table velocity may support, for some applications, improved contrast tracking through patient vasculature. Shorter breath-hold times also reduce patient fatigue and patient discomfort.

Therefore, in accordance with one embodiment of the present invention, a method of MR imaging includes the step of acquiring k-space data for less than all of k-space from a subject as well as the step of reconstructing the k-space data into image data having a first resolution. The method further includes the step of transforming the image data into k-space data as well as the step of processing the transformed k-space data into image data having a second resolution. The first resolution is different from the second resolution.

In accordance with another embodiment of the invention, an MRI apparatus includes an MRI system having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MRI apparatus also includes a computer programmed to execute an image generation technique that utilizes Hermitian symmetry and reconstruction of an image from MR data after the MR data has been corrected for non-uniformity.

In accordance with another embodiment of the invention, the invention is embodied in a computer program stored on a computer readable storage medium and having instructions which, when executed by a computer, cause the computer to transform a first image space dataset to a k-space dataset. The computer is then caused to partial Fourier reconstruct the k-space dataset into a second image space dataset and generate an image from the second image space dataset.

The present invention has been described in terms of the preferred embodiment, and it is recognized that equivalents, alternatives, and modifications, aside from those expressly stated, are possible and within the scope of the appending claims.

What is claimed is:

1. A method of MR imaging comprising:
   acquiring k-space data for less than all of k-space from a subject;
   reconstructing the k-space data into image data having a first resolution;
   transforming the image data into k-space data; and
   processing the transformed k-space data into image data having a second resolution, the first resolution being different from the second resolution.

2. The method of claim 1 wherein the step of transforming includes applying one of a Fast Fourier Transform (FFT) and a Radon transformation to the image data.

3. The method of claim 1 wherein the step of processing includes applying a partial Fourier transformation to the transformed k-space data.

4. The method of claim 3 wherein the partial Fourier transformation includes one of homodyne processing and POCS processing the transformed k-space data.

5. The method of claim 1 wherein the second resolution exceeds the first resolution.

6. The method of claim 1 further comprising the step of acquiring the k-space data from a subject being translated through an imaging volume.

7. The method of claim 1 wherein the step of reconstructing includes the step of replacing unacquired portions of k-space with zero-value data.

8. The method of claim 1 wherein the step of reconstructing includes the step of carrying out a moving table reconstruction of the k-space data.

9. The method of claim 1 wherein the step of reconstructing includes correcting for gradient non-uniformities.

10. The method of claim 9 configured to utilize Hermitian symmetry after the k-space is acquired and corrected.

11. The method of claim 9 configured to utilize Hermitian symmetry to improve resolution of an image generated from a loss than all k-space data acquisition.

12. An MRI apparatus comprising:
    a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images;
    a table configured to translate a patient through an imaging volume during data acquisition; and
    a computer programmed to execute an image generation technique that utilizes Hermitian symmetry in the reconstruction of an image from MR data alter the MR data has been corrected for moving table induced errors.

13. The MRI apparatus of claim 12 wherein the table is further configured to continuously translate the patient through the imaging volume during data acquisition.

14. The MRI apparatus of claim 12 wherein the image generation technique causes the computer to:
    acquire MR data of a patient;
    correct geometric distortions in the MR data;
    reconstruct the MR data to image data;
    transform the image data back to k-space data; and
    process the k-space data to generate image data with enhanced resolution.

15. The MRI apparatus of claim 14 wherein the computer is programmed to transform the image data by applying one of an FFT and a Radon reconstruction to the image data.

16. The MRI apparatus of claim 14 wherein the computer is programmed to process the k-space data by applying a partial Fourier reconstruction to the k-space data.

17. The MRI apparatus of claim 16 wherein the partial Fourier reconstruction includes homodyne reconstruction of the k-space data.

18. The MRI apparatus of claim 12 wherein the moving table induced errors include moving table induced phase error resulting from at least one of geometric distortions, changes in table position, and gradient non-uniformity.

19. A computer readable storage medium having stored thereon a computer program representing a set of instructions that when executed by a computer causes the computer to:
- transform a first image space dataset into a k-space dataset;
- partial Fourier reconstruct the k-space dataset into a second image space dataset; and
- generate an image from the second image space dataset.

20. The computer readable storage medium of claim 19 wherein the set of instructions further causes the computer to acquire an MR dataset from a moving object and reconstruct the MR dataset into the first image space dataset.

21. The computer readable storage medium of claim 20 wherein the set of instructions further causes the computer to correct gradient non-uniformities in the acquired MR dataset.

22. The computer readable storage medium of claim 21 wherein the set of instructions further causes the computer to zero-pad the MR dataset to have a desired dimension.

23. The computer readable storage medium of claim 19 wherein the set of instructions further causes the computer to transform the first image space dataset with an FFT.

24. The computer readable storage medium of claim 19 wherein the image has a resolution that would exceed that of an image generated from the first image space dataset.

25. The computer readable storage medium of claim 19 wherein the set of instructions further causes the computer to apply one of a homodyne reconstruction and a POCS reconstruction to partial Fourier reconstruct the k-space dataset.

* * * * *

UNITED STATES PATENT AND TRADEMARK OFFICE
CERTIFICATE OF CORRECTION

PATENT NO. : 6,975,113 B1
DATED : December 13, 2005
INVENTOR(S) : Gurr

It is certified that error appears in the above-identified patent and that said Letters Patent is hereby corrected as shown below:

<u>Column 8,</u>
Line 30, delete "loss" and insert -- less --.
Line 42, delete "alter" and insert -- after --.

Signed and Sealed this

Fourth Day of April, 2006

JON W. DUDAS
*Director of the United States Patent and Trademark Office*